United States Patent [19]

Seya et al.

[11] Patent Number: 5,420,436

[45] Date of Patent: May 30, 1995

[54] METHODS FOR MEASURING OPTICAL SYSTEM, AND METHOD AND APPARATUS FOR EXPOSURE USING SAID MEASURING METHOD

[75] Inventors: Eiichi Seya, Hachioji; Massaaki Ito, Murayama; Soichi Katagiri, Kodaira; Tsuneo Terasawa, Ome; Minoru Hidaka, Kodaira; Eiji Takeda, Koganei; Norio Saitou, Tokorozawa, all of Japan

[73] Assignee: Hitachi, Ltd., Tokyo, Japan

[21] Appl. No.: 155,857

[22] Filed: Nov. 23, 1993

[30] Foreign Application Priority Data

Nov. 27, 1992 [JP] Japan .................................. 4-318163

[51] Int. Cl.6 .......................... H01L 21/00; G01B 9/02
[52] U.S. Cl. ................................ 250/492.1; 250/492.2; 356/358; 355/55
[58] Field of Search ............... 250/492.1, 491.1, 492.2; 356/354–360, 363; 355/51, 55, 61

[56] References Cited

U.S. PATENT DOCUMENTS

| | | | |
|---|---|---|---|
| 4,387,966 | 6/1983 | Holly | 350/360 |
| 4,450,358 | 5/1984 | Reynolds | 250/492.1 |
| 4,704,033 | 11/1987 | Fay et al. | 356/363 |
| 4,820,049 | 4/1989 | Biegen | 356/360 |
| 4,904,084 | 2/1990 | Geary | 356/360 |
| 5,192,982 | 3/1993 | Lapucci | 356/360 |
| 5,231,467 | 7/1993 | Takeuchi et al. | 356/356 |
| 5,298,971 | 3/1994 | Huang et al. | 356/353 |

FOREIGN PATENT DOCUMENTS

| | | |
|---|---|---|
| 63-18626 | 1/1988 | Japan . |
| 1-244306 | 9/1989 | Japan . |
| 1471386 | 4/1977 | United Kingdom ................. 356/360 |

OTHER PUBLICATIONS

Applied Optics, vol. 13, No. 11, Nov. 1974, "Digital Wavefront Measuring Interferometer for Testing Optical Surfaces and Lenses", J. H. Bruning et al. pp. 2693–2703.

Primary Examiner—Jack I. Berman
Assistant Examiner—James Beyer
Attorney, Agent, or Firm—Fay, Sharpe, Beall, Fagan, Minnich & McKee

[57] ABSTRACT

A technique and exposure apparatus measures, with a high degree of accuracy, figure and placement errors of individual optical elements constituting optics embedded inside of an exposure apparatus or the like, with the optics kept in an embedded state as they are. The system measures the distribution of wavefront distortions in the optics while changing the positions of a light source and an image point inside an exposure field of the optics being observed. Optimal displacements of reflective surfaces constituting the optics are then found by calculation based on the measured distribution of wave-front distortions. Finally, the positions of the reflective surfaces are corrected in accordance with the calculated optimal displacements. The positions of the reflective surfaces are corrected by individually controlling displacements output by a plurality of actuators attached to each reflective surface and by mechanically modifying appropriate portions of the reflective surfaces.

14 Claims, 12 Drawing Sheets

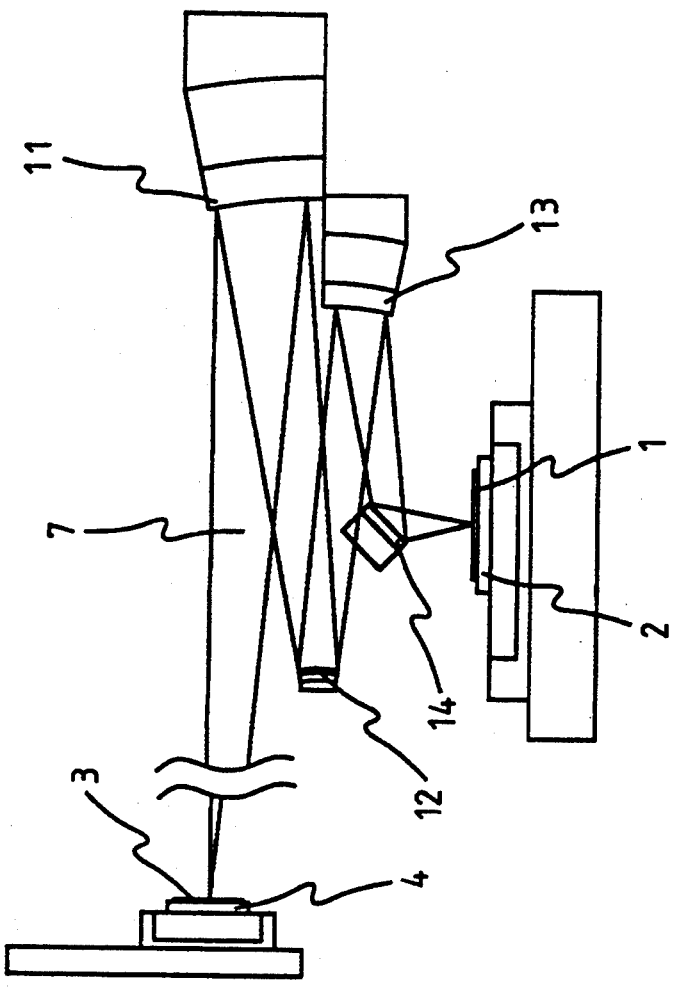
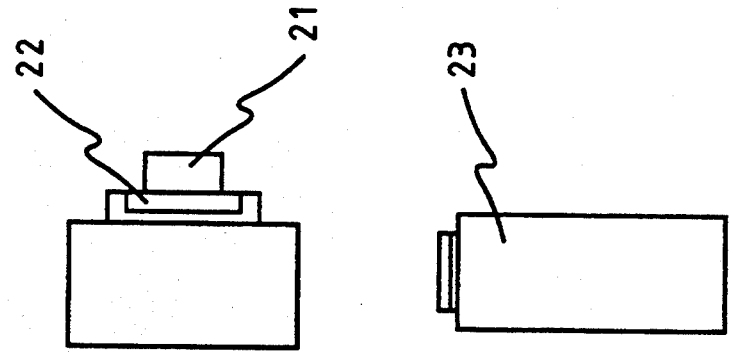
FIG. 3

METHODS FOR MEASURING OPTICAL SYSTEM, AND METHOD AND APPARATUS FOR EXPOSURE USING SAID MEASURING METHOD

BACKGROUND OF THE INVENTION

The present invention relates to a technique for measuring figure and placement errors of optical components constituting an optical system. The present invention further relates to an exposure method and an exposure apparatus for manufacturing semiconductor products by means of the technique.

At the present time, the reduction projection exposure method using ultraviolet light, which is widely used as a lithographic technique for fabricating semiconductor fine patterns, is said to have a resolution limit of the order of 0.1 μm. A pattern with a resolution higher or better than 0.1 μm cannot thus be created by a lithographic method using the ultraviolet light.

The reduction projection lithography using soft X rays with a wavelength in the range of 5 to 15 nm is, on the other hand, regarded as an effective technique for implementing the fabrication of such fine patterns. A typical configuration of a reduction projection exposure apparatus using such soft X rays is disclosed, for example, in Japanese Patent Laid-open No. 63-18626. Since an optical material with a refraction index usable in the soft X-ray region does not exist, however, a reflective optical system using curved reflectors is used in the X-ray reduction projection exposure apparatus for performing exposure of fine patterns in place of a refractive optical system utilizing lenses.

On the other hand, interferometric figure measurement is adopted in testification of the surface figure of a curved reflector employed in the optical system of the X-ray reduction projection exposure apparatus described above. A typical interferometric figure measuring apparatus is disclosed in Japanese Patent Laid-open No. 1-224306. In this interferometric figure measuring apparatus, a beam generated by a coherent light source is led to the reference surface of a half mirror. Part of the beam is reflected by the reference surface while the remaining portion of the beam is applied to a sample surface being measured where the beam is reflected thereby. These two reflected beams are superimposed on each other so as to result in interference. In this way, the surface figure of the sample can be measured by comparing it to the figure of the reference surface.

As for the method for evaluating an optical system, an article written in "Applied Optics, Vol. 13, No. 11, 2693-2703 (November 1974)" is a typical source of information that can be used as a reference.

In the X-ray reduction projection exposure apparatus disclosed in Japanese Patent Laid-open No. 63-18626, stress deformation of the reflector occurs due to a fixed force and its weight at the setting-up time of the reflector. In addition, thermal deformation also occurs during the exposure process as well. It is thus necessary to have an extremely high reflective-surface accuracy as well as an extremely high setting-up accuracy of the reflector in the X-ray reduction projection exposure apparatus. However, the X-ray reduction projection exposure apparatus has a problem in that it is difficult to sustain these kinds of accuracy in the course of exposure.

In addition, when evaluating the reflective-surface figure of the reflector employed in the X-ray reduction optical system, it is necessary to avoid deformation effects of the reflector in the setting-up thereof. It is therefore necessary to carry out the evaluation with the reflector set up on the apparatus as it is. In the case of the conventional interferometric surface measurement technique, however, it is necessary to install measuring optics comprising, among other components, a reference surface so as to expose the measuring optics to a surface being measured. As a result, the conventional interferometric technique has a problem of mechanical interference with another reflector employed in the X-ray projection optical system. It also has a problem in that no optical path can be secured for the measurement.

Further, wave-front distortion measurement adopting the conventional interference method can be applied to an optical system comprising a plurality of optical surfaces to provide wave-front distortion data which includes information indicating whether or not the optical characteristics of the optical system as a whole are good. However, wave-front distortion does result from superimposition of all effects of figure and placement errors. Accordingly, the wave-front distortion measurement also has a difficult problem that it provides no information as to how much the figure and position of each optical surface should be corrected.

SUMMARY OF THE INVENTION

In order to solve the problems encountered in the conventional measurement technologies described above, it is an object of the present invention to provide a measurement technique capable of measuring figure and placement errors of optical surfaces constituting an optical system for carrying out exposure processes and the like with a high degree of accuracy without the necessity to disassemble the optical system.

It is another object of the present invention, in order to implement X-ray reduction projection exposure having a high accuracy, to provide an exposure technique comprising the steps of:

measuring figure and placement errors of individual reflectors constituting an optical system with a high degree of accuracy with these reflectors incorporated at predetermined positions in the optical system as they are;

correcting the figure and placement errors of reflective surfaces of the reflectors based on results of the above measurement; and carrying out an exposure process while always keeping the amount of distortion of the optical system at a small value, and to provide an exposure apparatus for implementing the exposure technique.

In order to achieve the objects described above, figure and placement errors of individual optical surfaces constituting the optical system are measured by performing the processes of:

identifying the positions of a light-source and an image point and measuring wave-front distortions a number of times, at least twice, for finding wave-front distortions for a plurality of light-source positions during measurement of an optical system;

finding a set of coefficients indicating fluctuations in wave-front distortion caused by the figure and placement errors of the individual optical surfaces constituting the optical system; and finding the figure and placement errors of the individual optical surfaces constituting the optical system by calculation based on measurement values of the wave-front distortions and the coefficient set.

To be more specific, the coefficient set is used as constants for expressing linear relationships between the figure and placement errors and the wave-front distortions. These relationships are linear relationships obtained by approximation based on geometrical positions of the optical surfaces in the optical system.

To put it in more detail, the coefficient set is derived in advance from the geometrical positions of the optical surfaces employed in the optical system and stored in memory. Prior to or during the process of finding the figure and position errors by calculation described above, the coefficient set is read out from the memory for use in the calculation.

A process of calculating desirable displacements in geometrical position of the optical surfaces comprises the following sub-processes of:

finding coefficients and constant terms of simultaneous equations of unknown quantities including the desirable displacements at a plurality of points on the optical surfaces by multiplications and summations of matrices whose elements constitute the coefficient set described above, vectors whose elements are measured values of the wave-front distortions connected with ray positions inside the aperture, constant matrices, constant vectors and scalars; and finding solutions to the simultaneous equations by numerical calculation.

With another implementation of the present invention, the number of errors occurring in an optical system is reduced by adopting an exposure technique in the optical system which includes the following steps of:

finding figure and placement errors of individual optical surfaces constituting the optical system by calculation and measurement of wave-front distortions of projection optics at set-up positions of the optical system at exposure time; and correcting figures and positions of the optical surfaces with results obtained in the above process used as a base.

The number of errors occurring in an optical system at the beginning of an exposure process can be reduced by including the process of finding figure and placement errors of individual optical surfaces constituting the optical system and the process of correcting the figures and set-up positions of the individual optical surfaces prior to the exposure process.

The number of errors occurring in an optical system in the course of exposure can be prevented from increasing by including the process of finding errors of individual optical surfaces constituting the optical system as well as desirable displacements and the process of correcting the figures and set-up positions of the individual optical surfaces between two consecutive exposure processes in a sequence of numerous exposure processes which are carried out one after another.

The process of finding errors of optical surfaces constituting an optical system as well as desirable displacements comprises the following sub-processes of:

introducing a measurement beam into the optical system;

focusing the measurement beam on a point inside an exposure field on an original-pattern side in the optical system by adjusting the positions of focusing optics and a reference surface;

moving a concave mirror to such a position that the center of curvature thereof coincides with a position on which a beam originating from the point inside the exposure field cited above should be focused by the optical system;

measuring wave-front distortions of projecting optics by means of an interferometric technique;

measuring wave-front distortions of exposure optics at a plurality of points by repeating the above sub-processes; and finding figure and placement errors of the individual optical surfaces by calculation.

With still another implementation of the present invention, errors of optical systems employed in an exposure apparatus can be evaluated by equipping the exposure apparatus with a means for measuring wave-front distortions of the optical systems in addition to the optical systems themselves.

The means for measuring wave-front distortions described above comprises a light source emitting a beam to be used in measurement, an interferometric means, positionable focusing optics, a reference surface and a concave mirror fixed on a means for positioning an exposure object, allowing errors of individual optical surfaces constituting the optics to be measured.

Centers of curvature of the reference surface and the concave mirror described above are located on the surface of an original exposure pattern in a state of exposure and the plane of the exposure object's surface (in actuality, the surface of a wafer in a state of exposure), respectively.

The projecting optics comprise a plurality of reflectors. By providing each of the reflectors with actuators for changing the figure and position of the reflective surface of the reflector as well as a means for further controlling displacements requested by the actuators, the figure and position of the reflective surface can be corrected by re-forming the reflective surface even in the course of exposure.

By providing a means for storing a set of coefficients defining relationships between reflective-surface position errors occurring at a plurality of points on optical surfaces constituting the projecting optics and fluctuations in wave-front distortion occurring in the projecting optics, figure and placement errors can be calculated from wave-front distortions.

By providing a means for storing a set of coefficients defining relationships between displacements requested by the actuators and fluctuations in wave-front distortion occurring in the projecting optics, displacements by the actuators can be calculated from wave-front distortions.

In the following description, optics of an X-ray reduction exposure apparatus shown in FIG. 2 are taken as an example in order to explain effects of the present invention in concrete terms.

FIG. 1 is a diagram showing a configuration of the apparatus in a state of measuring wave-front distortions of its exposure optics. In order to sustain the high accuracy of the exposure optics employed in the apparatus, an interferometer 23 is provided to serve as a means for measuring errors of the optics. By moving an original-pattern stage 4 in an upward direction of the figure, a measurement beam 20 can be led to the exposure optics through a penetration hole 25, allowing errors to be measured.

The following is a detailed description of the principle of a technique for finding figure and placement errors of individual reflective surfaces constituting an optical system. It should be noted that the optical system comprises a plurality of reflective surfaces.

First of all, some technical terms used in the description below are explained. Geometrical positions of an aperture and a beam are shown in FIG. 6. The conception of "inside the aperture" is defined as a range in a solid angle as seen from the position of a light source on an original pattern. The range extends to an image point reached by a beam 52 from the light source through the optics. A ray position used in the following description means a path of any beam inside the aperture starting at the light source and ending at the image point. In order to indicate a ray position more precisely, a ray position is defined as a point of intersection where a ray positioned at the center of the aperture and a hypothetical plane or spherical surface perpendicular to the beam cross each other.

The description begins with an explanation of a relation between position errors of a reflective surface and length errors of a ray path with reference to FIG. 9. Wave-front distortion is a phase distribution of an imaging beam by ray position. The wave-front distortion is equivalent to a distribution from which the distribution of fluctuations in ray position of the ray-path length from the light source to the image point is excluded by the wavelength. Figure and placement errors of an optical element give rise to a position error E of a reflective surface 90 occurring in the direction of the normal line thereof. A relation between the position error E of the reflective surface and the length error $\Delta L$ of a ray path can be expressed by Equation (1) as follows:

$$\Delta L = 2E\cos\theta \qquad (1)$$

where $\theta$ is the angle of incidence of an incoming beam.

It should be noted that, strictly speaking, a length error of the ray path can also be considered as a result of vertical shifting of the beam which is caused by an angle error of the reflective surface. However, the reflective surface is a smooth mirror surface and the spacial wavelength of a figure error is equal to or greater than a value of the order of a few millimeters. Moreover, the position error E is equal to or less than a small value in a range of the order of a few tenths of $\mu m$. Accordingly, effects of a path-length error caused by an angle error are so small in comparison to the path-length error expressed by Equation (1) that the former can be neglected.

The position error E of the reflective surface caused by figure and placement errors is a function of position on the reflective surface. For example, the distribution of the position error E caused by the translational part of the placement error of the reflective surface is uniform over the entire surface. However, the distribution of the position error E caused by the rotational part of the placement error of the reflective surface is a function of the first degree. The sum of a distribution of placement errors determined in this way and a distribution expressed as a high-order function resulting from figure errors becomes the distribution of the position error E.

Because of this position error E, fluctuations in ray-path length are naturally a function of ray position. That is to say, a distribution of figure errors on a reflective surface, if any, will give rise to non-uniformity of path lengths appearing as a distribution inside the aperture. By measuring the nonuniformity of the path lengths or the wave-front distortion, information on the distribution of the position error E on the reflective surface can thus be obtained. However, the exposure optics are a combination of four reflective surfaces. Accordingly, the wave-front distortion is determined by total effects of errors of all the reflective surfaces. As a result, the distribution of position errors on each of the reflective surfaces cannot be found readily from the wave-front distortion.

In order to solve the problems described above, the present invention provides a technique for finding the distribution of position errors on each reflective surface. This technique is based on the fact that an aperture image moves on a reflective surface due to the movement of the position of a light source inside an exposure field. FIGS. 8a, 8b and 8c are diagrams showing that an aperture image moves on a reflective surface when the positions of a light source and an image point move inside an exposure field. To be more specific, FIG. 8a shows an exposure field 41 and FIG. 8b shows different positions of beams inside the aperture on the original pattern with the light source moving. FIG. 8c shows images of the apertures on a reflective surface 11. The image of an aperture is defined as a region on the reflective surface that reflects rays inside the aperture.

The optical system does not have a particular member for an aperture. The second reflective surface is used for defining an aperture instead. That is to say, a beam inside the aperture 51 on the original-pattern side and a beam inside the aperture 53 on the wafer side are defined by the diameter of a second reflective surface 12 as shown in FIG. 6. Beams inside the aperture for positions 42 and 43 inside the exposure field 41 shown in FIG. 8a are defined on the second reflective surface. Accordingly, the beams are denoted by reference numerals 44 and 45 shown in FIG. 8b. As a result, the images of the apertures 44 and 45 on the first reflective surface 11 shown in FIG. 8c are denoted by reference numerals 46 and 47 respectively. It is thus obvious that an aperture image moves on the reflective surface, depending on the position of the light source inside an exposure field.

FIG. 10 shows diagrams used for explaining a method of identifying which reflective surface an error causing distortion is originated from. The reflective surface is identified from variations as to how distortion is generated. These variations are, in turn, caused by movement of the positions of the light source and an image point inside an exposure field. Here, the generation of distortion caused by figure errors on a reflective surface is explained. Columns a and b shown in FIG. 10 show distributions of figure errors on a reflective surface and the state of movement of aperture images on the reflective surface, respectively. Columns c and d show distributions of ray-path-length errors in apertures that are obtained from error measurement with points 43 and 42 inside the exposure field 41 of FIG. 8a taken as a light-source position respectively. Rows 1 to 4 correspond to first to fourth reflective surfaces, respectively.

In the optical system, the second reflective surface 12 is used for defining apertures as described above. Accordingly, figure errors of the second reflective surface 12 shown on the second row of column a is reflected as ray-path-length errors shown in the second row of column c and placed at the same positions as they are. In other words, the ray-path-length errors do not move over the second reflective surface 12 even if the measurement point is changed.

On the other hand, the figure errors for the first, third and fourth reflective surfaces 11, 13 and 14 appear as ray-path-length errors at different locations as shown in columns c and d. This is because the position of the aperture image moves, depending upon the location of the measurement point as shown in column b. Comparison of the first row to the third row indicates that the aperture images 46 and 47 move in the opposite directions. Accordingly, the locations effected by the ray-path-length errors also move in the opposite directions as well. The direction of the movement is determined by the location of the reflective surface relative to the second reflective surface 12. That is to say, the aperture image and the ray-path-length errors move in a certain direction if the reflective surface is located on the light-source side of the second reflective surface 12 or, otherwise, in the opposite direction. In addition, the distances of movement on the fourth reflective surface 14 are greater than those on the third reflective surface 13. This is because the fourth reflective surface 14 is separated away from the second reflective surface 12 farther than the third reflective surface 13.

From the above relations, it is obvious that a reflective surface of local figure errors causing distortion can be identified. To be more specific, the surface which the distortion depends on is identified by carrying out measurement at a plurality of points inside an exposure field and then examining how the position of the distortion moves when the measurement is changed from one point to another.

In general, however, errors of a reflective surface are distributed over the entire area of the reflective surface. Moreover, all the reflective surfaces have errors at the same time. Therefore, it is impossible to obtain information on distribution of errors for each reflective surface unless a simultaneous-equation technique is adopted. In this technique, simultaneous equations on distributions of position errors for individual reflective surfaces are established and solutions to the simultaneous equations are then found.

The following is description of an actual computation technique based on simultaneous equations. In the following description, a vector and a matrix are expressed by notations with prefixes v and x appended thereto. For example, a vector E and a matrix M are represented by notations vE and xM respectively. In addition, the notation r is used for representing the number of reflective surfaces in order to make the explanation general. Furthermore, a group of points on each reflective surface is taken into consideration and the notation n is used for expressing the number of such points. Here, by setting the distance between two adjacent points to a length smaller than the spatial wavelength of figure errors that can be conceived, the figure and position of a reflective surface can be described almost uniquely by discrepancies in height position of the reflective surface at the points. The distribution of position errors of a reflective surface can be expressed by Equation (2) as an n-dimensional vector whose elements are position errors at the points on the reflective surface:

$$vEi = \begin{pmatrix} Ei1 \\ Ei2 \\ \cdot \\ \cdot \\ \cdot \\ Ein \end{pmatrix} \quad (2)$$

It should be noted that the subscript i of the position-error vector vEi denotes the number of a reflective surface where i=1 to r. The second subscript of the element of the position-error vector vEi denotes the number of a point on the reflective surface.

As for the ray-path-length errors, s paths inside an aperture are taken into consideration and associated with an s-dimensional vector whose elements are ray-path-length errors. Even for the same optical system, ray-path-length errors vary, depending upon the position of the measurement point inside the exposure field. The s-dimensional vector is expressed by Equation (3) as follows:

$$v\Delta Lk = \begin{pmatrix} \Delta Lk1 \\ \Delta Lk2 \\ \cdot \\ \cdot \\ \cdot \\ \Delta Lks \end{pmatrix} \quad (3)$$

The subscript k of the path-length error vector $v\Delta Lk$ in Equation (3) denotes the number of a measurement point inside the field, having a value in the range 1 to m, where m is the number of measurement points. The second subscript of the element denotes the number of a ray-path position inside the aperture.

Corresponding to deviational parts of path-length errors, wave-front distortions can be expressed as a vector by Equation (5) where xC is a constant matrix defined by Equation (4).

$$xC = \begin{pmatrix} 1 & & \\ & \cdot & \\ & & \cdot \\ & & & 1 \end{pmatrix} - \begin{pmatrix} 1/S & \cdots & 1/S \\ \cdot & \cdots & \cdot \\ \cdot & \cdots & \cdot \\ 1/S & \cdots & 1/S \end{pmatrix} \quad (4)$$

$$vRk = xC \cdot v\Delta Lk \quad (5)$$

$$= \begin{pmatrix} \Delta Lk1 - \sum_i (\Delta Lki/s) \\ \cdot \\ \cdot \\ \cdot \\ \Delta Lks - \sum_i (\Delta Lki/s) \end{pmatrix}$$

$$= \begin{pmatrix} \Delta Lk1 - \overline{\Delta Lk} \\ \cdot \\ \cdot \\ \cdot \\ \Delta Lks - \overline{\Delta Lk} \end{pmatrix}$$

The first term on the right-hand side of Equation (4) is an sth-order unit matrix whereas the second term is an sth-order square matrix whose elements are all 1/s. $\overline{\Delta Lk}$ shown in Equation (5) is an average value of all elements of the $v\Delta Lk$.

As described above, the position errors, path-length errors and wave-front distortions are defined as vectors by Equations (2), (3) and (5) respectively. Since the relation expressed by Equation (1) is linear, the relation between the vectors representing position and path-length errors can be expressed by Equation (6) as follows:

$$v\Delta Lk = \sum_{i=1}^{r} (xMik \cdot vEi) \tag{6}$$

What is indicated by Equation (6) is explained as follows. A distribution of position errors on a reflective surface has an effect on a distribution of path-length errors. However, the distribution of path-length errors is actually effected by a total sum of such effects for all reflective surfaces. The matrix xM shown in Equation (6) is an (sXr)-dimensional matrix representing a relation between the vectors representing position and path-length errors. The first subscript i of xMik represents the number of a reflective surface whereas the second-subscript k represents the number of a measurement point where i=1 to r and k=1 to m.

Elements on each column of the matrix xM constitute a column vector. An element of a column vector is a coefficient which represents how much an element of the vector representing path-length errors is affected by a reflective-surface error of a unit quantity existing at a point on a reflective surface. Such column vectors are further arranged horizontally to constitute the matrix xM whose elements are coefficients. The coefficient matrix xM can be found from Equation (1) by examining the number of a point closest to a position on a reflective surface from which a ray is reflected and the angle of incidence of the ray. The examination is carried out for rays corresponding to all the elements of the vector representing path-length errors. As has already been described, the values of the coefficients can be found by calculation with a sufficiently high degree of accuracy from the geometrical design of the optical system on the assumption that the reflective-surface errors are small.

Substituting the relation expressed by Equation (5) into Equation (6) yields Equation (7) as follows:

$$vRk = \sum_{i=1}^{r} (xC \cdot vMik \cdot vEi) \tag{7}$$

Equation (7) shows a relation between the vectors representing position errors and wave-front distortions. Based on the fact that m equations hold true simultaneously for all measurement points, Equation (7) can also be regarded as vector simultaneous equations for the position-error vectors vE1 to vEr. Accordingly, if the values of the position-error vectors can be found by solving Equation (7), the distributions of position errors on all the reflective surfaces can also be found eventually.

In actuality, however, some problems are encountered. First of all, the problems are examined by comparing the number of unknowns to the number of conditions as follows. The number of unknowns is equal to (nXr), a product of the dimensional size n of the position-error vector and the number of reflective surfaces r. On the other hand, the number of conditions is equal to (sXm), a product of the dimensional size s of the vector representing wave-front distortions and the number of measurement points m. Since the number of reflective surfaces r is known, it is necessary to find the values of n, s and m that satisfy the equation nXr=sXm. That is to say, there is a problem that the dimensional sizes of the vectors representing position errors and wave-front distortions cannot be determined arbitrarily. The same holds true for the number of measurement points.

In addition, it is generally impossible to design imaging optics for pattern projection to give characteristics with no distortion at all. Usually, design values allow for some amount of distortion to a certain degree that practically gives rise to no problems. Therefore, there are no solutions that, from the beginning, can completely nullify the amount of distortion in such an optical system. It is thus expected that the simultaneous equations represented by Equation (7) cannot naturally be solved even if the values of n, s and m described above are determined.

In order to solve the problems described above, a pricing function is expressed in terms of square integrations of RMS (Root Mean Square) aberration distributions. Then, optimum values that minimize the pricing function are found as solutions. Under a condition that measurement points are distributed in a sufficiently fine and uniform manner, the norm of the vector representing wave-front distortions is approximately equal to a product of a constant and the RMS aberration. In addition, the summation of the squared norms for all the measurement points is about equal to the product of a constant and the square integration of the RMS aberration distribution inside the exposure field mentioned above. Based on these two approximate equalities, a pricing function G expressed by Equation (8) is used in the actual design.

$$G = \sum_{k=1}^{m} |vRk|^2 \tag{8}$$

Since the pricing function G expressed by Equation (8) is a quadratic function of a position-error vector, a known method can be used to find changes in the position vector that make the pricing function minimum. In other words, let vEia be a position-error vector at the time wave-front distortions are measured and $v\Delta Ei$ be a vector representing position displacements. Then, the problem can be translated into how to find the values of $v\Delta Ei$ that minimize the value of the quadratic pricing function G of (vEia+$v\Delta Ei$).

It should be kept in mind, however, that the set of solutions that makes the pricing function minimum has a freedom of r degrees, where r is the number of reflective surfaces. Accordingly, the set of solutions cannot be determined uniquely. This is attributed to the fact that wave-front distortion corresponds to deviations in ray path. That is to say, variations in solutions that change the ray-path length by a fixed amount over the entire surface of the aperture have no effect on the wave-front distortion and the pricing function G. Thus, such variations for individual surfaces remain as the freedom cited above. In the present invention, solutions are eventually found by numerical calculation. Accordingly, the fact that the solutions are not unique is not desirable because such solutions will cause the numerical calculation to diverge.

In such a case, it is generally desirable in the implementation to select the smallest and yet satisfactory displacement vector vΔEi among the solutions. There are some techniques that can be used for finding such a displacement vector. Here, a technique using a cost function is described. In this technique, a pricing function G1 is used in place of the pricing function G described previously. As expressed by Equation (9), the pricing function G1 is a sum of the pricing function G, and a product of a positive constant and the total sum of the norms of the vectors vΔEi.

$$G1 = \sum_{k=1}^{m} |vRk|^2 + \gamma \sum_{i=1}^{r} |v\Delta Ei|^2 \quad (9)$$

where $\gamma$ is the positive constant. It is necessary to select a proper value for $\gamma$ so that displacements from the optimum values of the solutions due to the introduction of the second term on the right-hand side of Equation (9) are sufficiently small and, in addition, the uniqueness of the solutions can be sustained to such a degree that the accuracy of the subsequent numerical calculation does not deteriorate.

Hereafter, optimum displacement vectors vΔEi are found. The condition of a minimum pricing function G1 is that the partial differentials δG1/δEij of the pricing function G1 with respect to the elements Eij of the position-error vectors vEi are equal to zero as expressed by Equation (10).

$$\left.\frac{\partial G1}{\partial Eij}\right|_{vEi=vEia+v\Delta Ei} = 0 \quad (10)$$

The condition $vEi = vEia + v\Delta Ei$ in Equation (10) holds true for all values of i, where the vectors vEia are position-error vector at measurement time. The elements of the position-error vector vEqa are constants whose values are not known.

In order to make the following description easy to understand, the partial differential δG/δEij of the pricing function G with respect to the element Eij of the position-error vector vEi is derived by treating G as a function of Ei. It is obvious from Equations (7) and (8) that the pricing function G is indeed a function of Ei. The derivation results in Equation (11) as follows:

$$\frac{\partial G}{\partial Eij} = \frac{\partial}{\partial Eij}\left(\sum_{k=1}^{m}|vRk|^2\right) \quad (11)$$

$$= \frac{\partial}{\partial Eij}\left(\sum_{k=1}^{m} {}^tvRk \cdot vRk\right)$$

$$= 2\sum_{k=1}^{m} {}^tvRk \cdot \frac{\partial}{\partial Eij}(vRk)$$

$$= 2\sum_{k=1}^{m} {}^tvRk \cdot \frac{\partial}{\partial Eij}\left(\sum_{q=1}^{r} xC \cdot xMqk \cdot vEq\right)$$

$$= 2\sum_{k=1}^{m} {}^tvRk \cdot xC \cdot xMik \cdot vej$$

$$= 2\sum_{k=1}^{m} {}^tvej \cdot {}^txMik \cdot {}^txC \cdot vRk$$

$$= 2\sum_{k=1}^{m} {}^tvej \cdot {}^txMik \cdot {}^txC \cdot \left(\sum_{q=1}^{r} xC \cdot xMqk \cdot vEq\right)$$

As expressed by Equation (9), G1 is equal to the sum of two terms: G and the summation of the norms of position-error vectors vΔEi. Accordingly, the partial differential of G1 with respect to the element Eij of the position vector vE1 as indicated by the left-hand side of Equation (10) can also expressed by the sum of two terms: the partial differential of G and the partial differential of the summation of the position-error vectors' norms with respect to the element Eij of the position vector vE1. The first term, that is, the partial differential of G, can be expressed by Equation (12) as follows:

$$\left.\frac{\partial}{\partial Eij}\left(\sum_{k=1}^{m}|vRk|^2\right)\right|_{vEi=vEia+v\Delta Ei} = \quad (12)$$

$$2\sum_{k=1}^{m} {}^tvej \cdot {}^txMik \cdot {}^txC \cdot \left(\sum_{q=1}^{r} Mqk \cdot (vEqa + v\Delta Eq)\right) =$$

$$2\sum_{k=1}^{m} {}^tvej \cdot {}^txMik \cdot {}^txC \cdot \left(vRka + \sum_{q=1}^{r} xC \cdot xMqk \cdot v\Delta Eq\right)$$

The notation vej in Equation (12) is a unit vector whose jth element is 1 and a vector vRka represents measurement values of the wave-front distortions at the kth measurement point where k=1 to m.

Likewise, the second term, that is, the partial differential of the summation of the position-error vectors' norms, can be expressed by Equation (13) as follows:

$$\left.\frac{\partial}{\partial Eij}\left(\gamma \sum_{q=1}^{r}|v\Delta Eq|^2\right)\right|_{vEi=vEia+v\Delta Ei} = \quad (13)$$

$$\frac{\partial}{\partial \Delta Eij}\left(\gamma \sum_{q=1}^{r}|v\Delta Eq|^2\right) =$$

$$\frac{\partial}{\partial \Delta Eij}\left(\gamma \sum_{q=1}^{r}({}^tv\Delta Eq \cdot v\Delta Eq)\right) =$$

$$2\gamma \sum_{q=1}^{r} {}^tv\Delta Eq \cdot \frac{\partial}{\partial \Delta Eij}(v\Delta Eq) = 2\gamma \cdot {}^tv\Delta Ei \cdot vej = 2\gamma \cdot \Delta Eij$$

Utilizing Equations (12) and (13), the set of equations expressed by Equation (10) can be rewritten into Equation (14) as follows:

$$\gamma \cdot \Delta Eij + \sum_{k=1}^{m} {}^tvej \cdot {}^txMik \cdot {}^txC \cdot \left(\sum_{q=1}^{r} xC \cdot xMqk \cdot v\Delta Eq\right) = \quad (14)$$

$$-\sum_{k=1}^{m} {}^tvej \cdot {}^txMik \cdot {}^txC \cdot vRka$$

The displacement vector vΔEi for each surface is the only unknown on the left-hand side of Equation (14).

Since the value of the expression is the sum of inner products of the vectors $v\Delta Ei$ and constant vectors, it is obvious that the left-hand side of Equation (14) is a linear combination of elements of the vectors $v\Delta Ei$. That is to say, the set of equations expressed by Equation (14) is seen as simultaneous linear equations having the elements of each vector $v\Delta Ei$ as unknowns. Since the number of unknowns is nxr and, thus, equal to the number of equations, the simultaneous equations can be solved by using the ordinary technique. As shown in Equation (15), an nxr-dimensional column vector $v\Delta E$ is defined. As shown in the equation, the column vector $v\Delta E$ further consists of column vectors $v\Delta Ei$ arranged vertically.

$$v\Delta E = \begin{pmatrix} v\Delta E1 \\ \cdot \\ \cdot \\ \cdot \\ v\Delta Er \end{pmatrix} \quad (15)$$

Equation (14) holds true for i=1 to r and j=1 to n, where i and j are both integers. Accordingly, the (n×r) simultaneous equations represented by Equation (14) can be rewritten vertically into a p-subscripted matrix form as follows:

$$xA \cdot v\Delta E = vC \quad (16)$$

$$cp = -\sum_{k=1}^{m} t_{vej} \cdot t_{xMik} \cdot t_{xC} \cdot vRka$$

$$apw = \gamma\delta pw + \sum_{k=1}^{m} t_{vej} \cdot t_{xMik} \cdot t_{xC} \cdot xC \cdot xMtk \cdot veu$$

where $v\Delta E$ is the column vector defined by Equation (15),
vC is a vector whose pth element is cp,
xA is a coefficient matrix whose (p,w)th element is apw,
cp and apw are expressed by Equation (16a)
where i and j are integers satisfying the following equations:

$n(i-1)+j=p$ and $1 \leq j \leq n$.

Also, t and u are integers satisfying the following equations:

$n(t-1)+u=w$ and $1 \leq u \leq n$.

From the equation defining apw, it is obvious that the coefficient matrix xA is the sum of a certain matrix, and a product of a unit matrix and a constant. Accordingly, by properly selecting the value of the coefficient $\gamma$, the coefficient matrix xA can always be converted into a regular matrix. In other words, it is clear that the simultaneous equations expressed by Equation (16) can be always solved by numerical calculation to give unique solutions that satisfy their conditions.

It should be noted that selecting too large a value of the coefficient $\gamma$ will cause the number of errors included in the solutions to increase as has already been explained. Setting $\gamma$ at too small a value, on the other hand, will make the solutions less unique and lead to divergence of the numerical calculation described above. Thus, in order to minimize the number of computation errors, it is desirable to compute correct solutions as follows. The above numerical calculation is started with a large value of the coefficient $\gamma$. The calculation is then repeated while decreasing the value of $\gamma$ and ended immediately prior to the divergence of the calculation. The solutions obtained immediately before the difference are then taken as the correct ones.

The above description shows that the solutions to the simultaneous equations expressed by Equation (16) are optimal solutions that minimize wave-front distortions. The description also indicates that the simultaneous equations can be solved actually by numerical calculation. In other words, a technique for obtaining optimal amounts of correction for reflective-surface position errors has been explained. Based on results obtained from measurement of wave-front distortions at a plurality of observation points, this technique utilizes relations between position errors of reflective surfaces and fluctuations in wave-front distortion to set the square integration of RMS (Root Mean Square) aberration values as a pricing function which is then minimized to give optimal amounts of correction.

It should be noted that, from discussions held so far, it is obvious that the constant and linear parts of the optimal amounts of correction for reflective-surface position errors obtained by adopting the technique described above can be used for correcting placement errors of the surfaces. The second and higher-order parts are, on the other hand, optimal corrections for figure errors of the reflective surfaces.

The following is a description of the measurement of wave-front distortions at a plurality of observation points which is necessary for the calculation mentioned above. The configuration of an apparatus which is being used for measuring wave-front distortions is shown in FIG. 1. As shown in the figure, a measurement beam 20 generated by an interferometer 23 reaches a focusing lens 26 and a reference surface 21 through plane mirrors 32 and 33. A first-substrate positioning means 4 having an original pattern moves in the upward direction of the figure, leading the measurement beam 20 to an optical system through a penetration hole 25. A second-substrate positioning means 2 is moved so that the center of curvature of a concave spherical mirror 24 coincides with an image point. In this way, the wavefront distortion of projection optics can be measured by embracing the same principle as the conventional technique. In the case of this apparatus, however, the positions of the concave spherical mirror 24 and the reference surface 21 can be adjusted. It is thus possible to measure wavefront distortions at a plurality of observation points by changing the positions of a light source and the image point relative to the optical system.

By adopting the technique described above, a value by which the position of a reflective surface should be corrected can be obtained as a function of reflective-surface position for all reflective surfaces. Accordingly, by providing a mechanism for controlling the position and the figure of each reflective surface, an ideal optical system can be realized.

A typical structure of reflective surfaces equipped with such a mechanism is shown in FIGS. 11a and 11b. Reference numeral 71 designates piezo actuators arranged as an array between a reflective surface 11 and a reflective-surface base 72. Both ends of the piezo actuators 71 are fixed to the reflective surface 11 and the reflective-surface base 72. A proper driving voltage is applied to each of the piezo actuators 71. The driving voltage has a value depending on the position of the piezo actuator 71 in the array. The driving voltage allows the position of the reflective surface 11 to be adjusted and the figure thereof to be changed arbitrarily.

A variation in wave-front distortion of the optical system caused by a unit displacement output by each of the piezo actuators 71 is actually measured in advance. The unit displacement output by the piezo actuators 71 results in variation values which are then organized in matrices. In the calculation described above, the matrices is used in place of the matrices xM. In this way, a vector representing optimal displacements output by the piezo actuators 71 can be found directly by embracing entirely the same principle and method of calculation as those described above.

BRIEF DESCRIPTION OF THE DRAWINGS

FIG. 3 is a model diagram showing a rough configuration of the embodiment implementing the X-ray reduction projection exposure apparatus in accordance with the present invention with wave-front displacements of an optical system thereof being measured;

FIG. 11b is a cross-sectional view of the reflector shown in FIG. 11a;

DESCRIPTION OF THE PREFERRED EMBODIMENTS

The present invention will become apparent from the following detailed description of preferred embodiments with reference to accompanying diagrams.

Figure 1:
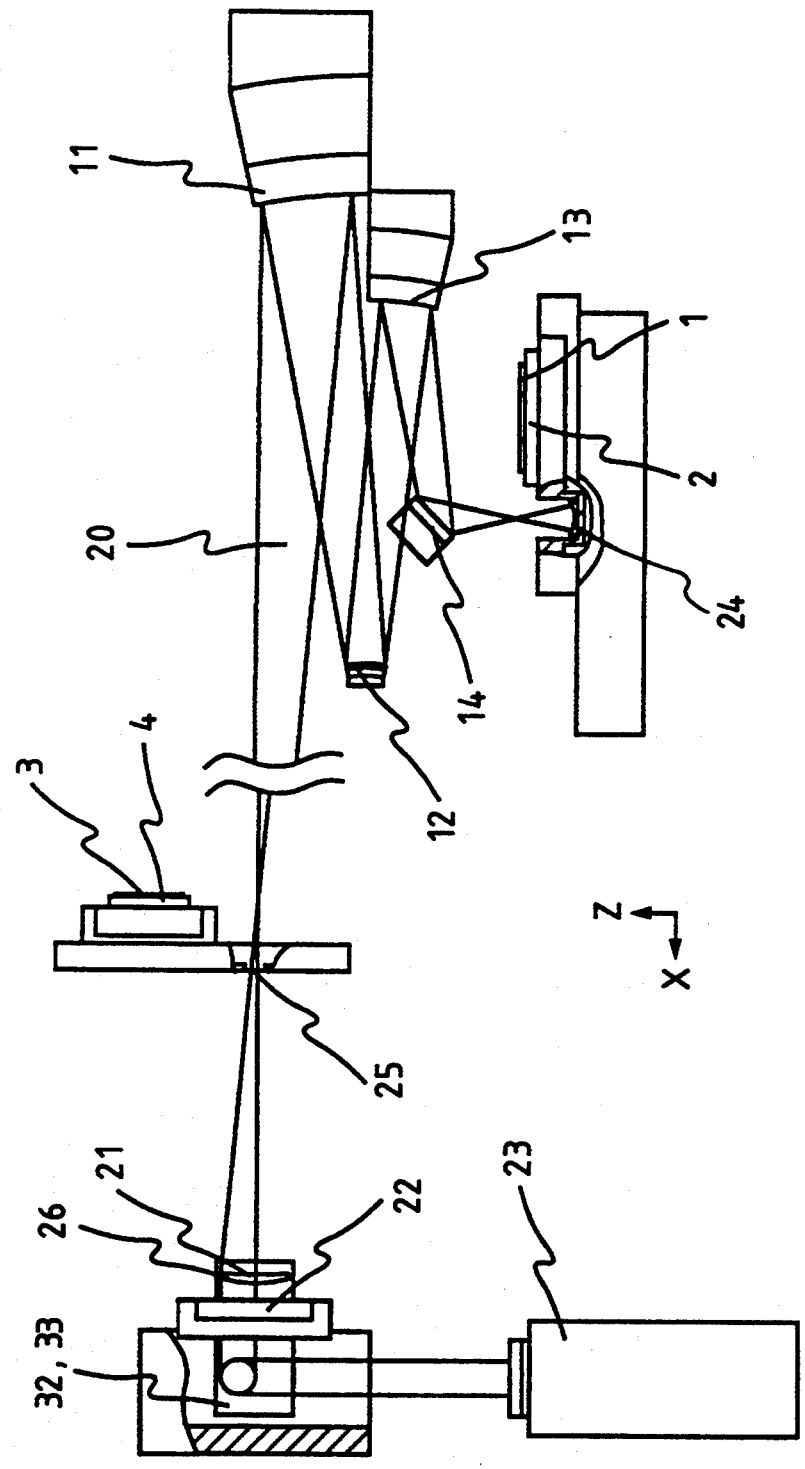
FIG. 1 is a model diagram showing a rough configuration of an embodiment implementing an X-ray reduction projection exposure apparatus in accordance with the present invention.
Figure 2:
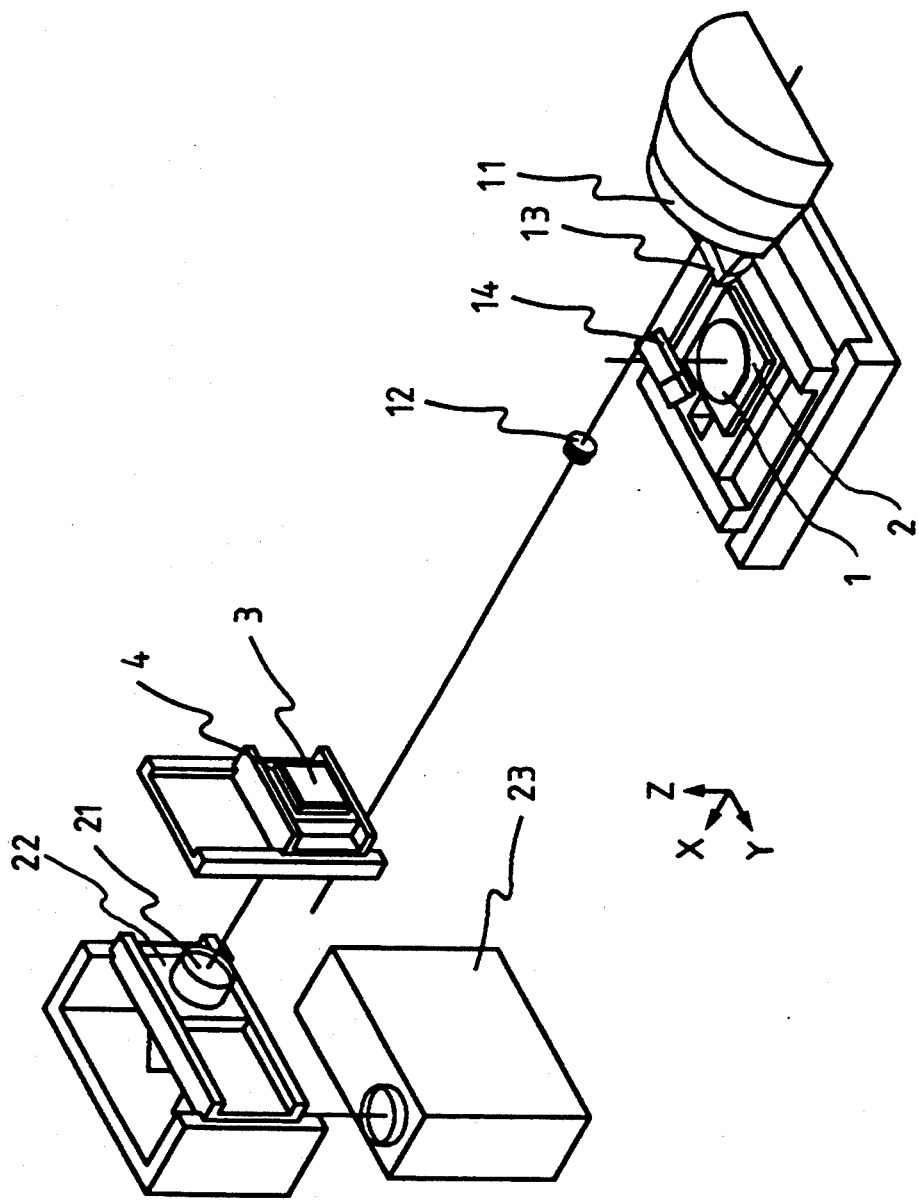
FIG. 2 is a perspective view showing a rough configuration of the embodiment implementing the X-ray reduction projection exposure apparatus in accordance with the present invention with an exposure process being carried out.

FIG. 2 is a perspective view showing a rough configuration of an embodiment implementing an X-ray reduction projection exposure apparatus in accordance with the present invention with an exposure process being carried out. In addition, FIG. 1 is a model diagram showing a rough configuration of an embodiment implementing an X-ray reduction projection exposure apparatus in accordance with the present invention. Furthermore, FIG. 3 is a model diagram showing a rough configuration of an embodiment implementing an X-ray reduction projection exposure apparatus in accordance with the present invention with wave-front displacements of an optical system thereof being measured. It should be noted that the apparatus is used for exposing and projecting a semiconductor fine pattern onto a wafer. A soft X ray with a wavelength of 13 nm is used as an exposure beam.

As shown in FIG. 3, a soft X ray is applied to a first substrate 3 provided with an original pattern during an exposure operation by X-ray illuminating optics which are not shown in the figure. A soft X ray 7 reflected by the first substrate 3 is focused by first, second, third and fourth reflective surfaces 11, 12, 13 and 14 which constitute projection optics. The focused soft X ray 7 creates an image on a wafer that serves as a second substrate 1. The first and third reflective surfaces 11 and 13, which constitute the projection optics, are each a concave surface as seen from the X direction of the figure. The concave surfaces each have a half-circular external form. The second reflective surface 12 is a convex surface with a circular external figure resembling those of the first and third reflective surfaces 11 and 13. The reflective surfaces 11, 12 and 13 are aspheric surfaces whereas the fourth reflective surface 14 is a plane surface.

Figure 7:
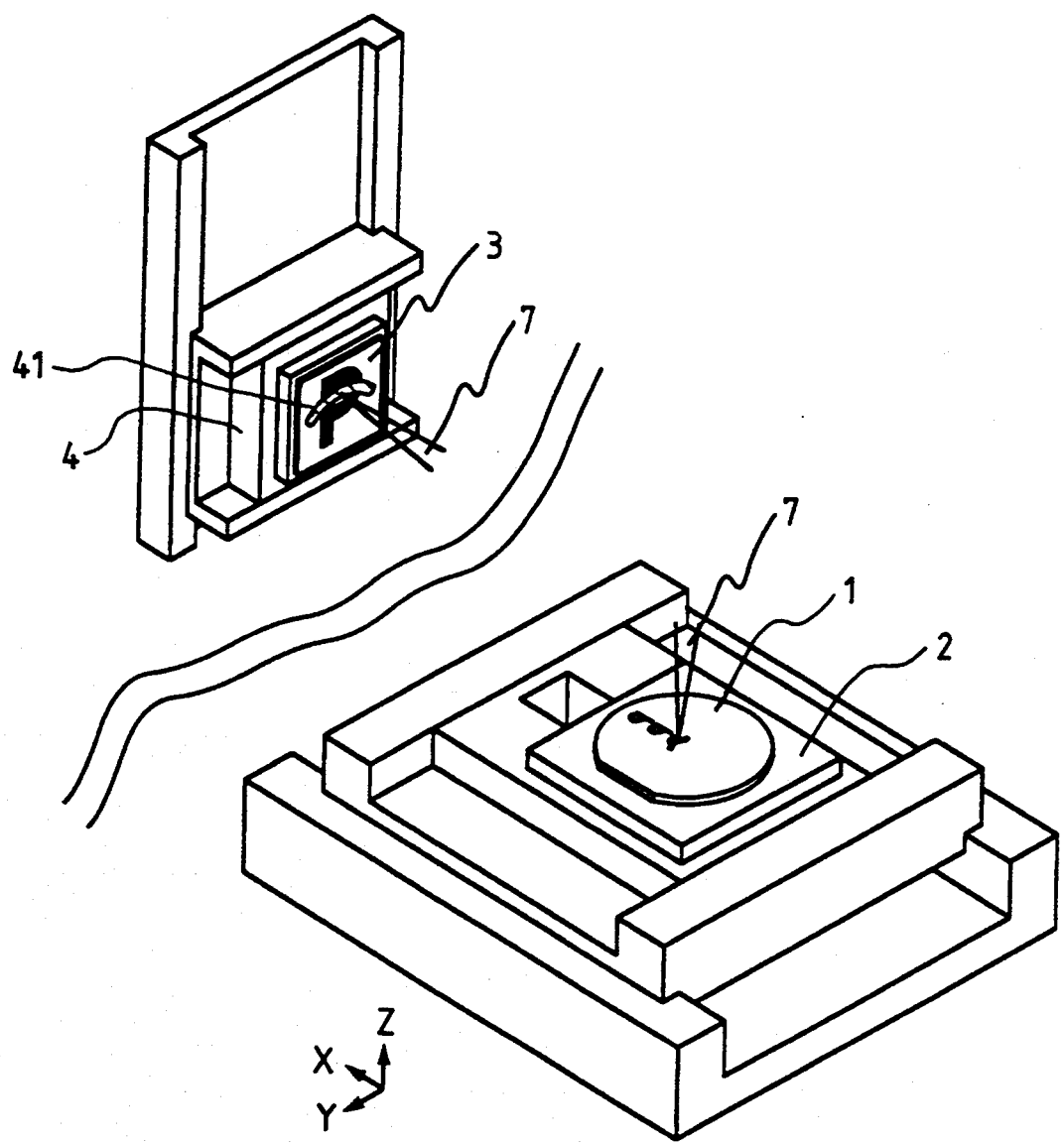
FIG. 7 is a perspective view showing the state of pattern projection.
Figure 8A:
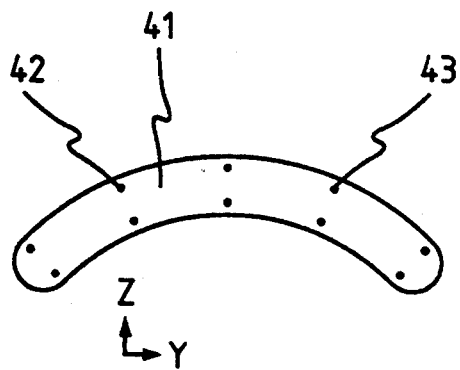
FIG. 8a is a diagram showing an exposure field.
Figure 8B:
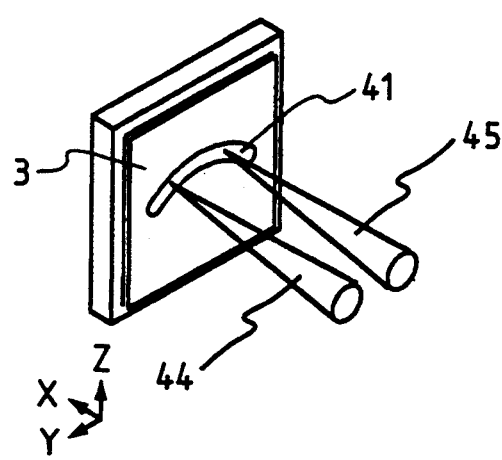
FIG. 8b is a diagram showing beams inside an aperture.
Figure 8C:
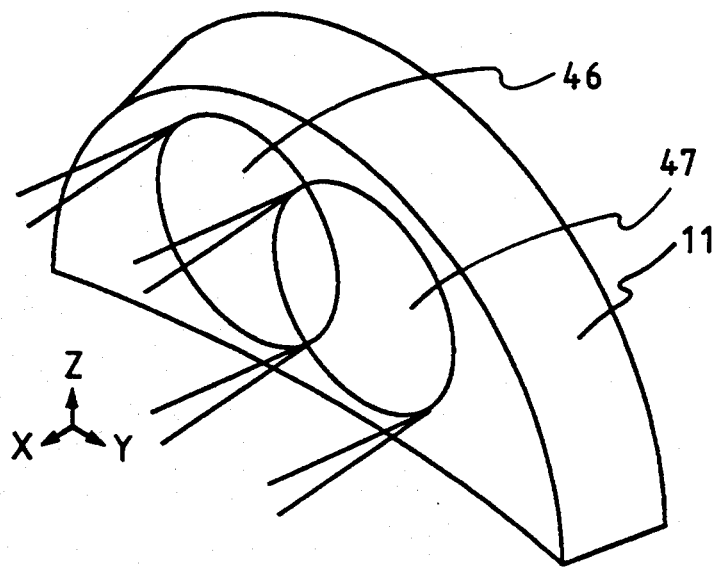
FIG. 8c is a diagram showing aperture images on a reflective surface.
Figure 10:
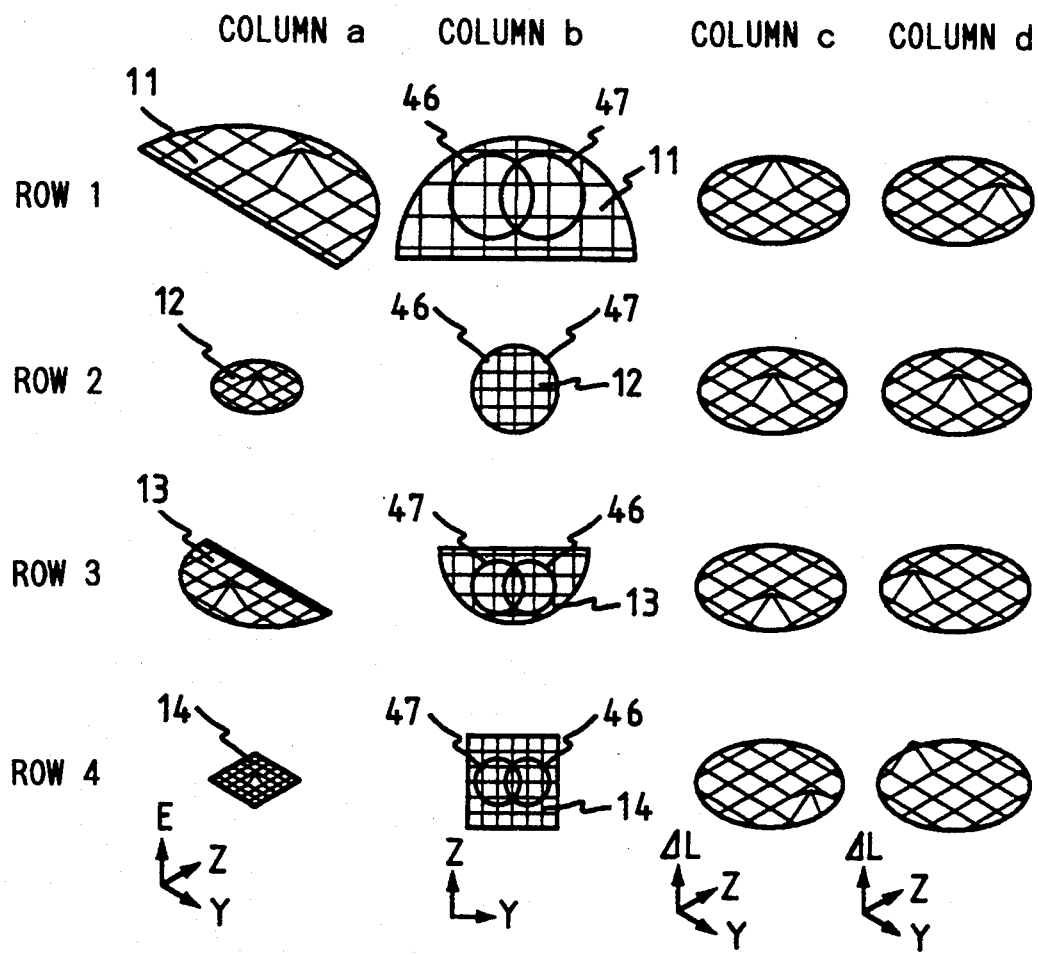
FIG. 10 is a diagram showing relations between figure errors and wave-front distortions for several reflective surfaces.

FIG. 7 is a perspective view showing the state of pattern projection carried out by the apparatus. In the state shown in the figure, a pattern inside an exposure field 41 on the first substrate 3 is projected onto the wafer serving as the second substrate 1. In order to transfer the entire surface of the pattern, synchronous scanning is adopted. In the synchronous scanning, a first-substrate positioning means 4 and a second-substrate positioning means 2 are continuously moved. Reduction optics having a wide field could otherwise be used to transfer a pattern over the entire surface of a chip in one exposure operation in place of the synchronous scanning. However, it is impossible to design such projection optics due to strict restrictions thereon.

An interferometer 23, focusing optics 26, a reference surface 21 and a spherical mirror 24 of the apparatus shown in FIG. 1 constitute a means for measuring wave-front distortions. A measurement beam 20 generated by the interferometer 23 reaches the focusing optics 26 through plane mirrors 32 and 33. The focusing optics 26 are a convex lens. As shown in the figure, the right-hand-side surface of the convex lens 26 also serves as the reference surface 21. It is a half mirror forming an exactly spherical surface with its center coinciding with the position of the focus on the right-hand side. Part of the measurement beam 20 is reflected by this surface, returning along the original path. The remaining part is led into the reduction optics through an aperture 25 on the first-substrate positioning means 4. The remaining part then travels along the same path as the exposure beam (or the soft X ray) 7, hitting the spherical concave mirror 24 provided on the second-substrate positioning means 2. Positioning is carried out by operating the second-substrate positioning means 2 so that the center of curvature of the spherical concave mirror 24 coincides with an image position of the measurement beam 20. In this way, it is possible to measure wave-front distortions by means of the interferometer 23.

Figure 4:
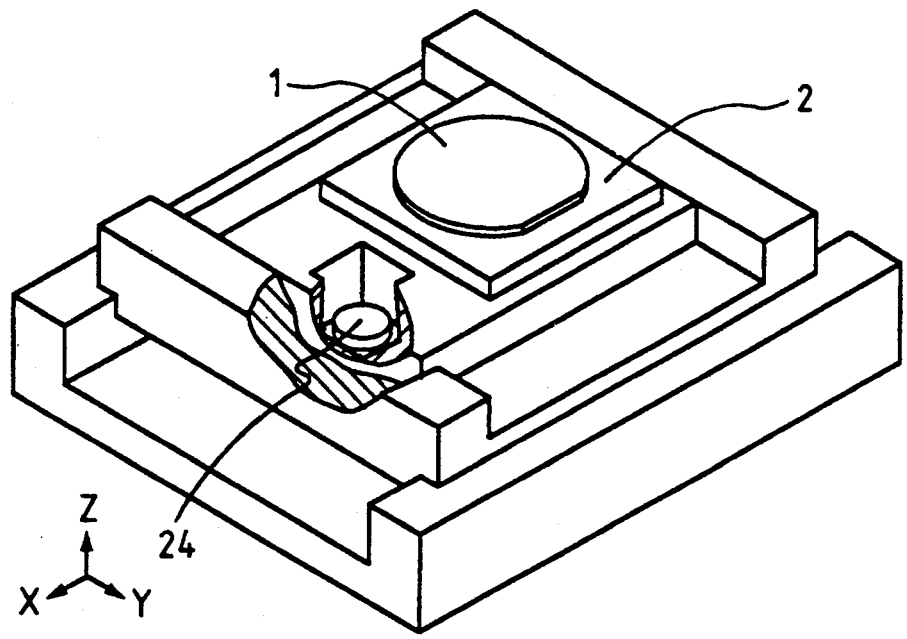
FIG. 4 is a perspective view showing the structure of a second-substrate positioning means.

FIG. 4 is a perspective view showing the structure of the second-substrate positioning means 2. As shown in the figure, the spherical concave mirror 24 is installed on a moving portion on one side of the second-substrate positioning means 2 in such a way that the center of curvature of the spherical concave mirror 24 is placed at the same altitude as the surface of the second wafer substrate 1. In the course of exposure, the second-substrate positioning means 2 is moved so that the surface of the second wafer substrate 1 coincides with the image point of the exposure beam 20. During the measurement of wave-front distortions, the second-substrate positioning means 2 is further moved in the X direction shown in the figure so that the center of curvature of the spherical concave mirror 24 coincides with an image position of the measurement beam 20.

Figure 5:
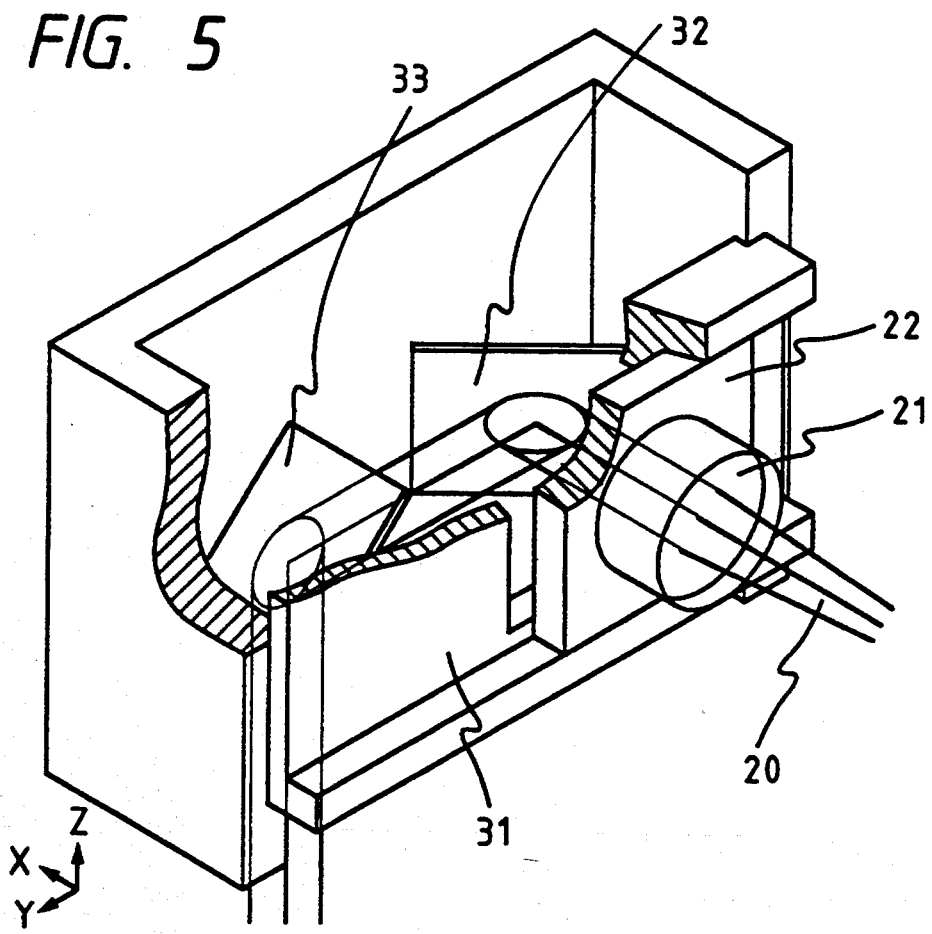
FIG. 5 is a perspective view showing the structure of a reference-surface positioning means.
Figure 6:
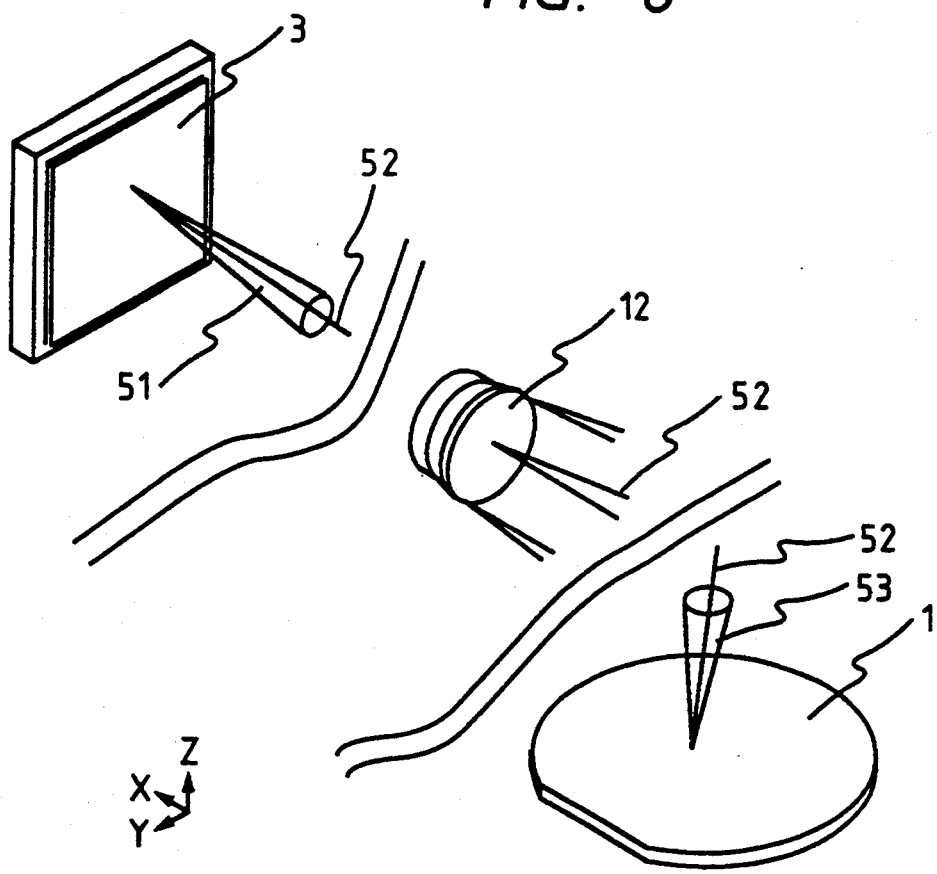
FIG. 6 is a diagram showing geometrical positions of an aperture and a ray in the optical system.
Figure 9:
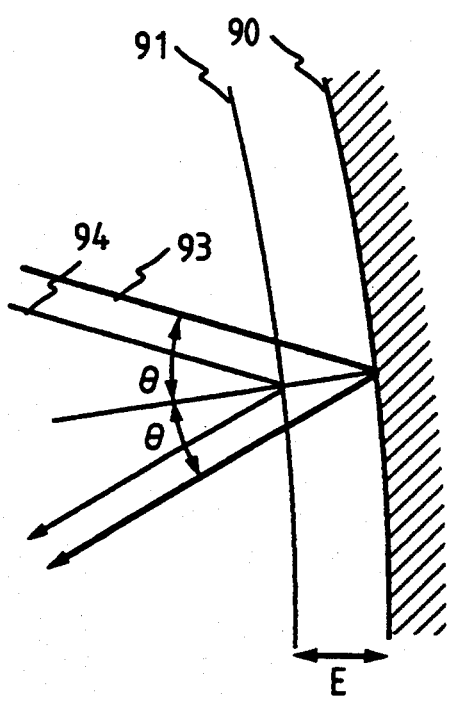
FIG. 9 is a diagram showing a change in ray path with a reflective-surface displacement.

FIG. 5 is a perspective view showing the structure of a reference-surface positioning means 22. As shown in the figure, the focusing optics 26 and the reference surface 21 are fixed on the reference-surface positioning means 22 which can be moved in the X and Y directions. The path of the measurement beam 20 generated by the interferometer 23 is bent by the plane mirrors 33 and 32 prior to its arrival at the reference surface 21. The plane mirrors 33 and 32 are fixed on a unit 31 moving in the Z direction and the reference-surface positioning means 22 respectively. Accordingly, the optical axis of the measurement beam originating from the interferometer 23 and then hitting the reference surface 21 will never move over the reference surface 21 because of the movement of the reference surface 21. In addition, the reference-surface positioning means 22 is positioned so that the measurement beam is focused by the focusing optics 26 on a point on the original pattern undergoing exposure. Therefore, the measurement beam enters the projection optics through entirely the same optical path as the exposure beam (or the soft X-ray) 7 reflected by the original pattern during exposure. Since the spherical concave mirror 24, the focusing optics 26 and the reference surface 21 can all be moved, it is possible to measure wave-front distortions at a plurality of observation points by changing the positions of the light source and the image point relative to the reduction optics.

The measurement begins with fine adjustment of the positions of the reference surface 21 and the spherical concave mirror 24 so as to minimize the wave-front distortion at the center of an exposure field. The wave-front distortion is then measured. Subsequently, observation points are located correctly inside the exposure field, an area where the projection optics function effectively as imaging optics. The observation points are located by operating the positioning means with the reduction rate taken into consideration. At each observation point, the wave-front distortion is measured. The measurement is repeated for each observation point. The optics used in the measurement of wave-front distortions at a plurality of observation points described above may introduce a reduction-rate error and image distortion. In this case, there may be observation points for which a discrepancy exists between the actual image point and the hypothetical image point assumed in the measurement. The effect of such a discrepancy appears as an error of the path length inside the aperture which is reflected in results of measurement as if a wave-front distortion were present.

In the apparatus, however, Equation (16) is used in the calculation of a surface-position displacement in the direction normal to the surface based on the data of wave-front distortions. Accordingly, results obtained from the measurement are amounts of displacements that minimize the total sum of RMS aberrations related to positions each adjusted to coincide with the center of curvature of the spherical concave mirror 24 instead of the actual image point of the measurement. In other words, even if a reduction-rate error and image distortion are introduced in measurement results by this apparatus, it is possible to obtain displacements of surface positions that correct the reduction-rate error and image distortion.

It should be noted that the apparatus employs reflectors which each have a multilayer film on its surface to increase the reflecting power of the soft X ray. Strictly speaking, a location on the surface to reflect a measurement beam is thus different from a location inside the multilayer film to reflect the soft X ray. Even if the reflection locations are both on the very same reflective surface, the angle of incidence varies from optical path to optical path, giving rise to some differences in path-length distribution inside the aperture. As a result, it is desirable to evaluate the differences and save them as data in advance to be added later to measurement results of wave-front distortions in a process of compensating the measurement results.

Figure 11A:
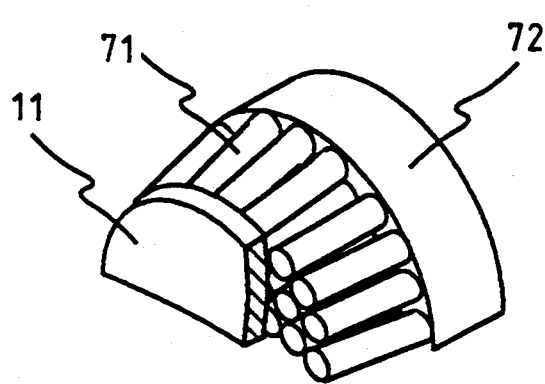
FIG. 11a is a perspective view showing a typical structure of a reflector.
Figure 11B:
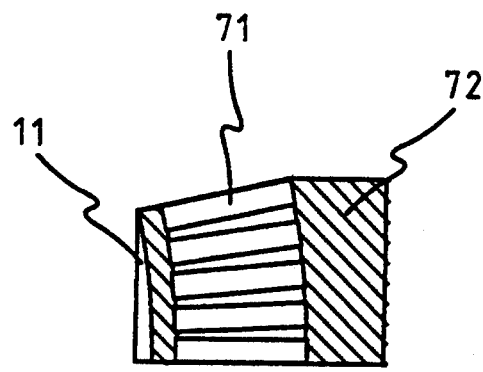

FIG. 11a is a perspective view showing a typical structure of a reflective surface equipped with a figure controlling mechanism, and FIG. 11b is a cross-section diagram of the reflective surface shown in FIG. 11a. Reference numeral 71 designates piezo actuators arranged as an array between a reflective surface 11 and a reflective-surface base 72. Both ends of the piezo actuators 71 are fixed to the reflective surface 11 and the reflective-surface base 72. A proper driving voltage is applied to each of the piezo actuators 71. The driving voltage has a value depending on the position of the piezo actuator 71 in the array. The driving voltage allows the figure of the reflective surface 11 to be changed arbitrarily. Since the reflective surface 11 is made of a substance which is sufficiently thin and flexible in comparison to the reflective-surface base 72, almost no deformation occurs on the reflective-surface base 72. When correcting the figure of the reflective surface 11, a driving voltage is applied to each of the piezo actuators 71 in order to correct the reflective surface 11 into a desirable figure. It is necessary to accurately keep this driving voltage thereafter until the next correction. It should be noted that since the piezo actuators 71 have hysteresis and non-linearity characteristics, it is desirable to adopt a technique for reducing the number of errors by repeating the figure correction and the error measurement in order to control the figure with a sufficiently high degree of accuracy.

Figure 13:
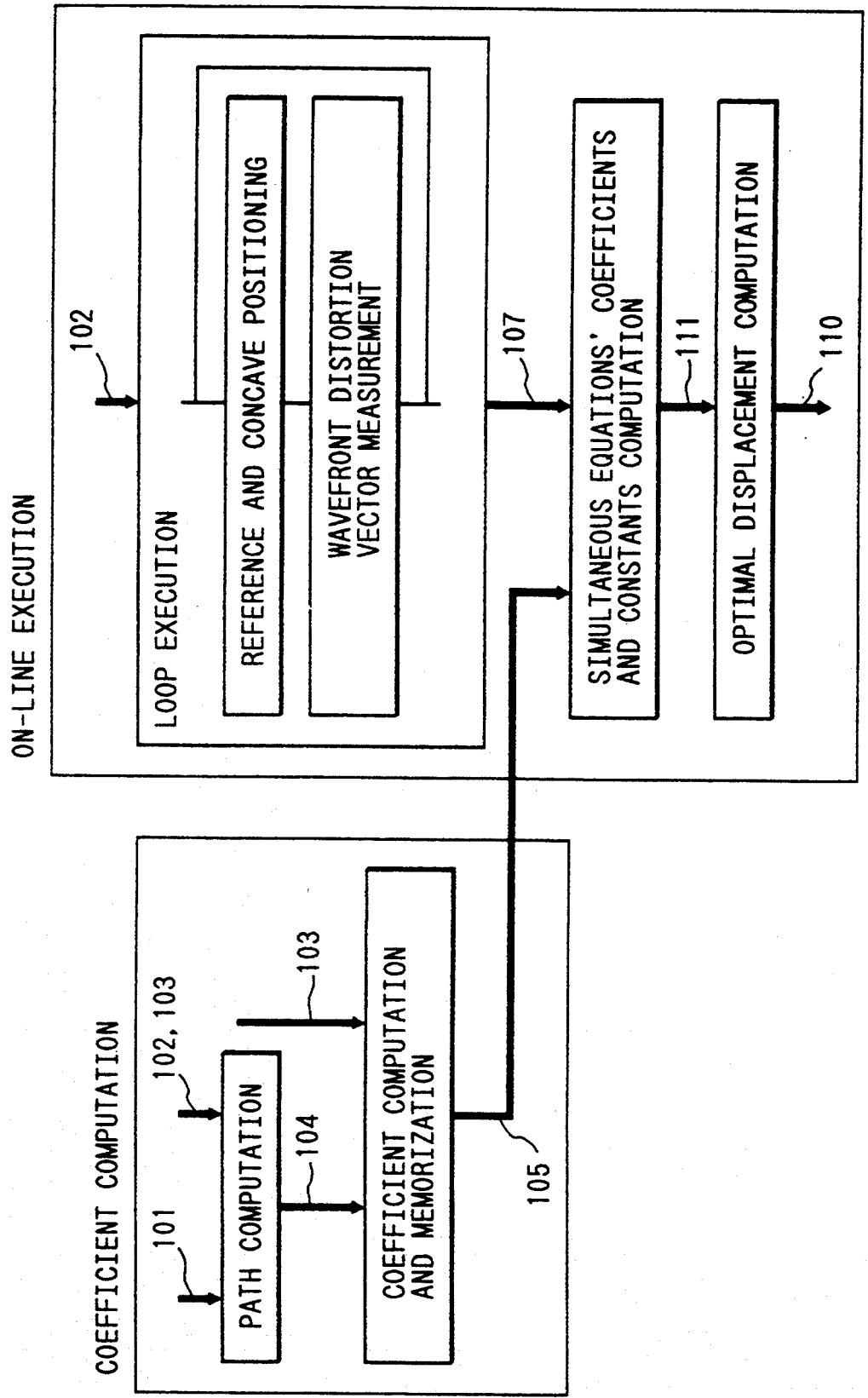
FIG. 13 shows a calculation procedure.

FIG. 13 shows a procedure for calculating errors of the reduction optics. Thick arrows shown in the figure denote flows of data. Blocks enclosed by thin lines on the left side are calculation of a set of coefficients defining a relation between reflective-surface position errors and path-length deviations.

Individual optical paths are computed from data 101 representing a geometrical layout of the reflective surfaces and data 102 indicating the positions of observation points inside the field to find data 104 showing angles of incidence of the ray. The data 104 is then used in conjunction with data 103 showing a layout of point groups on each reflective surface to find a set of coefficients 105 defining a relation between reflective-surface position errors and path-length deviations.

The coefficient set 105 is expressed as matrices. Column vectors constituting the coefficient matrices 105 each indicate changes in optical-path length that happen to a group of beams inside the aperture due to a unit surface-position error in the direction of a line normal to the surface at a certain point on a certain surface. On the other hand, row vectors of the coefficient matrix each denote how much optical lengths of a certain ray position inside the aperture change at a variety of points on a reflective surface due to a unit surface-position error. In the actual calculation, the positions and numbers for a point group on each reflective surface for expressing surface-position errors of each reflective surface as a vector are defined. Similarly, the position and the number of a set of measurement points in the exposure field are defined. In addition, the position and number of a set of ray positions inside the aperture for expressing distribution of wave-front distortions as vectors are defined.

Next, an assumed measurement point on an assumed reflective surface closest to a position at which an assumed beam is reflected and an angle of incidence at this position are found. According to Equation (1), the element of the row vector corresponding to the point on the reflective surface is set to $2\cos(\theta)$. Since a surface-position error at another point on the reflective surface does not contribute to the variation in optical-path length of the assumed ray position, the other elements of the row vector can all be set to zeros. If two or more points closest to the reflection position are found on the reflective surface, the value $2\cos(\theta)$ can be distributed among elements of the row vector that correspond to the closest points. In this case, the sum of elements of the column vector must be made equal to $2\cos(\theta)$, the magnitude of a change in optical-path length resulting from a unit-length movement by the entire area of the reflective surface in the direction of a line normal to the reflective surface.

Setting the coefficient matrix in accordance with the operations described above results in column vectors in the coefficient matrices which each indicate changes in optical-path length due to a unit surface-position error in the direction of a line normal to the surface at a certain point on a certain surface as described above. If the certain point is outside the image of the aperture on the reflective surface, the surface-position error will not give rise to a change in optical-path length. Accordingly, all elements of the column vector are of course zeros.

There is no guarantee, however, that for a point inside the image of the aperture on the reflective surface, inversely, a non-zero element always exists. This is because, in the case of a distribution density of reflection positions of beams lower than the distribution density of the group of points on the reflective surface, all assumed points may not be points closest to the reflection position of any beam. In this case, elements of the column vector are all zeros.

Accordingly, the approximation which assumes that a surface-position error at this point of question does not affect the distribution of optical-path lengths inside the aperture is not correct. In order to prevent such a thing from happening, it is necessary to increase the density of the ray positions to such a value that, for any point inside the image of the aperture, a beam always exists, making the point a point closest to the reflection position of the beam. In other words, it is necessary to define ray positions for defining vectors representing wave-front distortions described above. In the definition of the ray positions, their density or their total number must be determined so that the distribution density of reflection positions inside an aperture image on any arbitrary reflective surface is at least equal to or greater than the distribution density of the group of points on the reflector.

By carrying out the operations described above, the relation between surface-position errors and variations in optical-path length can be found by approximation as a linear relation. It should be noted that a rather large amount of computation is involved in this part. There are also portions that do not require measurement results of wave-front distortions. It is thus desirable to perform computation based on the designed figure of the reduction optics in advance and then to store results of the computation in a storage circuit rather than to find them using on-line processing.

On the other hand, the part on the right-hand side of FIG. 13 is the calculation of a set of coefficients for simultaneous equations used for computing position displacements of reflective surfaces that minimize the integration value of RMS aberrations inside an aperture in accordance with measurement results of wave-front distortions and Equation (16). The part on the right-hand side also includes calculation of solutions to the simultaneous equations by numerical computation. The calculations of the part on the right-hand side are both carried out through on-line processing.

To be more specific, data 102 showing a layout of measurement points inside an exposure field is used as a base for an iterative process of selecting a measurement point and measuring wave-front distortion at that point. The iterative process results in measurement values 107 of the wave-front distortion. The measurement values 107 are used in conjunction with the set of coefficients 105 output by the computation on the left-hand side to find coefficients and constant terms of the simultaneous equations which should be satisfied by optimal correction values of errors. By solving the simultaneous equations by numerical calculation, optimal correction values, that is, figure and placement errors of individual reflective surfaces can be found.

It should be noted that the calculations described above are carried out for finding position displacements for reflective surfaces. As an alternative, variations in wave-front distortion of an optical system caused by a unit displacement output by actuators are found by actual measurements and stored in a storage circuit in advance. Matrices taking the measured variations as elements thereof are then used in place of the coefficient matrix needed in the calculation described above. In this way, a vector representing optimal displacements output by the actuators can be directly found as well by using entirely the same calculation method and configuration as those described above.

In this case, however, even though the job of computing displacements output by the actuators from position-error correction values can be omitted, relations between the displacements and variations in wave-front distortion are approximated as linear relationships. Accordingly, actual surface figures resulting from correction using displacements found by calculation may contain errors if non-linearity exists in characteristics of the actuators. As mentioned earlier, it is thus desirable to carry out measurement, calculation and correction repeatedly. In this case, RMS aberrations also need to be integrated in addition to displacements output by the actuators. As a criterion as to when the loop iteration is to be terminated, it is desirable to verify that results of the integration are smaller than permissible values. In this way, accuracy can be enhanced.

After an exposure process is carried out in this apparatus with a fixed period of time taken as a limit, surface figures are measured and optical-element errors are corrected prior to the next exposure operation in order to sustain the accuracy of optical systems employed in the apparatus. This method allows errors occurring in the optical systems to be always suppressed below a certain level.

Figure 12:
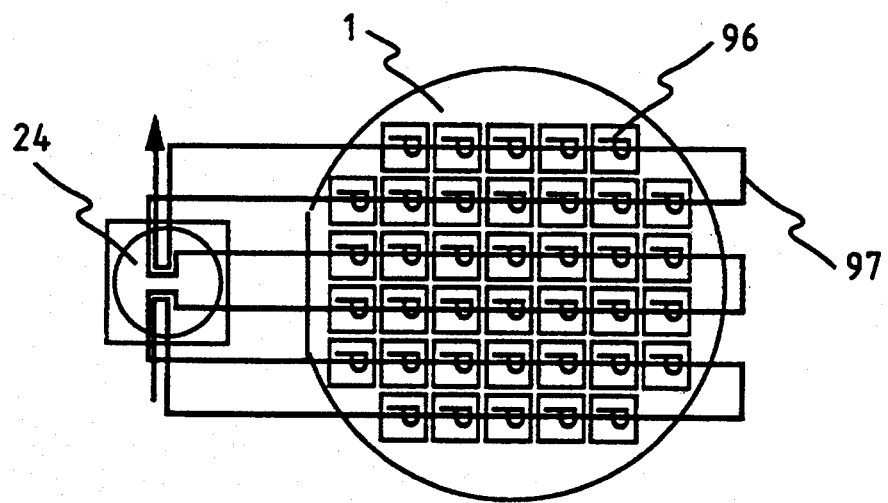
FIG. 12 is a diagram showing a typical exposure sequence.

FIG. 12 is a diagram showing a typical exposure sequence. In this exposure technique, after two pieces of chip patterns 96 have undergone exposure along a path 97 back and forth in accordance with the continuous movement of a second-substrate positioning means 2, a spherical mirror 24 is positioned to an image point before wave-front distortion is measured. In this way, the distance along which the second-substrate positioning means 2 is moved can be shortened. Accordingly, the number of bad effects on the throughput can be reduced as well. It should be noted that such an exposure procedure can be implemented with ease by providing an exposure function to software executed on a computer for controlling the exposure operation.

Figure 14:
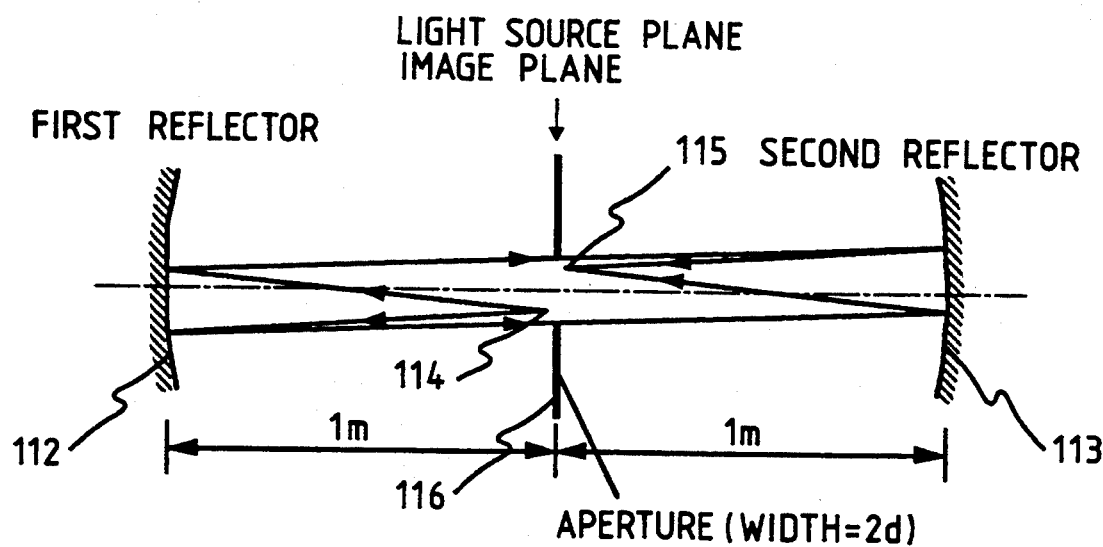
FIG. 14 is a diagram showing a cylindrical optical system to be simulated.

As for detection of figure errors according to the present invention, results of simulation are described as follows. FIG. 14 is a diagram showing a cylindrical optical system to be simulated. As shown in the figure, the optical system is constituted by imaging optics comprising two reflective surfaces 112 and 113 on both sides and a light-source surface 114, an imaging surface 115 as well as an aperture 116 at the center. Calculation was carried out with the number of point groups on the reflective surface set at 3 (s=3) and the number of measurement points inside the exposure field set also at 3 (m=3).

Figures to be corrected are plane and cylindrical surfaces which intersect the optical axis perpendicularly. Wave-front distortions were calculated from optical-path lengths found by geometrical computation. Assuming the-calculated wave-front distortions as measured data, an optimal surface-figure displacement for each surface was then calculated.

Figure 15A:
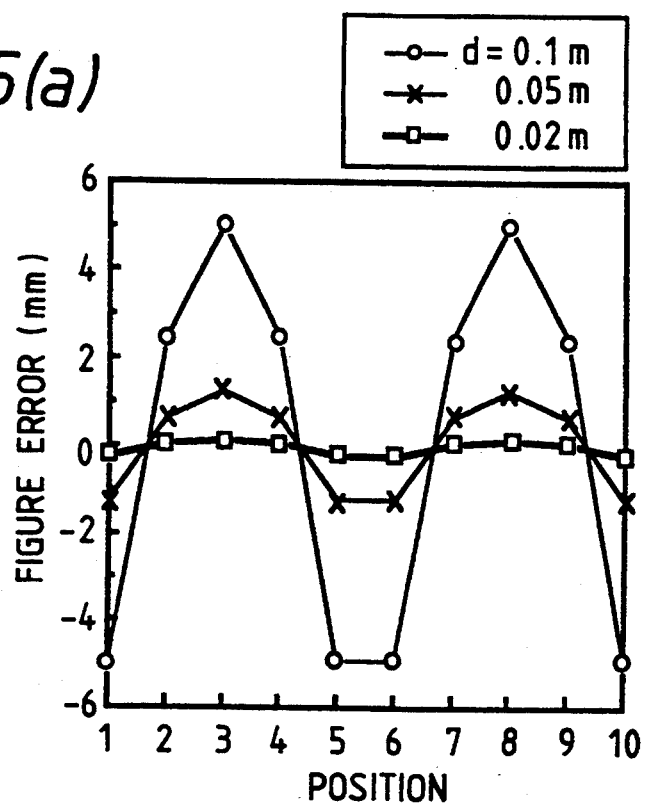
FIG. 15a shows curves representing optimal figure corrections relative to a planar surface.
Figure 15B:
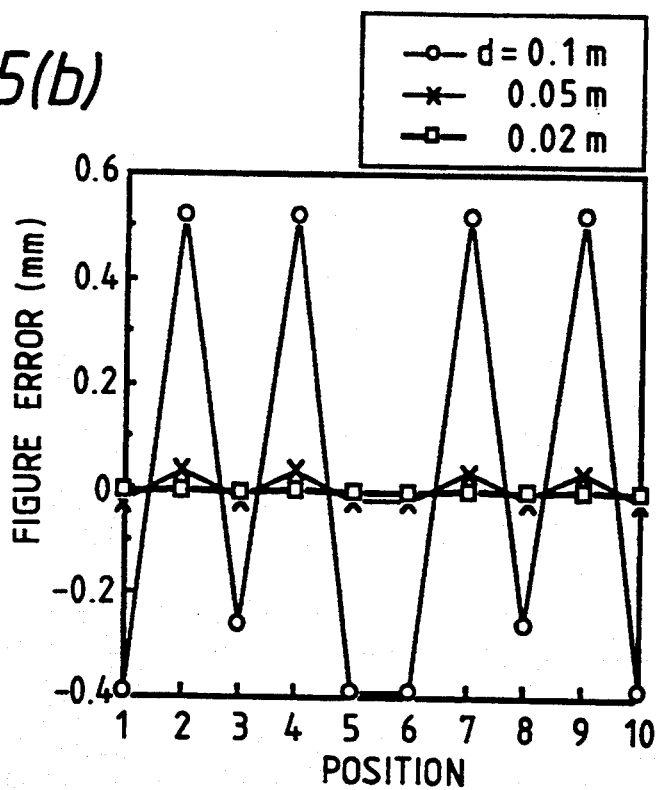
FIG. 15b shows curves representing optimal figure corrections relative to a cylindrical surface.

FIG. 15a and 15b show curves representing optimal surface-figure corrections obtained from the calculations described above. Positions 1 to 5 and 6 to 10 are points on the first and second reflective surfaces respectively. The curves representing optimal displacements from a plane surface shown in FIG. 15a are parabolic for both the reflective surfaces while the curves representing optimal displacements from a cylindrical surface shown in FIG. 15b resemble the letter "W" for both the reflective surfaces. The difference between the two group of curves is due to the fact that the calculated optimal displacements are relative to different start figures. The figures of the corrected surfaces relative to the plane and cylindrical surfaces match each other, having a parabolic figure which is optimal when seen from another optical calculation as is expected.

Figure 16:
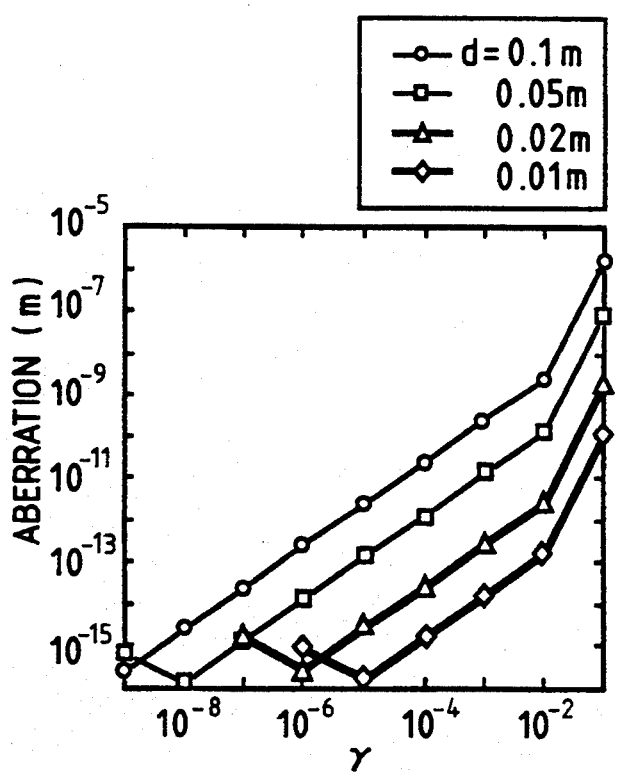
FIG. 16 shows curves representing residual aberrations.

FIG. 16 shows curves representing relations between post-correction residual RMS (Root Mean Square) aberrations and values of a weighting coefficient $\gamma$. As a result of carrying out double-precision operations, the post-correction residual RMS aberration can be lowered to a value smaller than 10–15 m, say, a value of $10^{-6}$ nm, if the value of the weighting coefficient $\gamma$ is properly selected. In other words, in the example of calculations for finding optimal surface-figure displacements of both the reflective surfaces based on measured wave-front distortions, high accuracy was obtained. The accuracy obtained in this calculation example is sufficiently high even if compared to the accuracy required by X-ray reduction exposure optics.

It is obvious from the explanation given above that the present invention provides a method for accurately measuring figure and placement errors of optical surfaces which give rise to optical aberration. The figure and placement errors are measured by measuring wave-front distortion of the optics as a whole without removing the optics and optical elements from the apparatus.

In addition, the present invention provides an exposure technique capable of measuring, at all times, figure and placement errors of optical surfaces which give rise to an aberration in exposure optics, and which is capable of correcting the errors.

In addition, the present invention provides an exposure apparatus capable of measuring, at all times, figure and placement errors of optical surfaces which give rise to an aberration in exposure optics, and which is capable of correcting the errors.

What is claimed is:

1. A measurement method for light or X-ray optics, comprising:
    a first process of measuring wave-front distortions at a plurality of observation points in effective imaging regions of said optics for a light source and an image point, wherein said first process comprises the steps of:
    positioning said light source and said image point at one of said observation points in each of said effective imaging regions;
    measuring a wave-front distortion at said one observation point where said light source and said image point are positioned;
    repeating said positioning and measuring steps for obtaining wave-front distortions at all of said observation points, and
    a second process of finding surface displacements at a plurality of points on surfaces of optical elements constituting said optics in directions normal to said surfaces by calculation based on measured values of said wave-front distortions at all of said observation points.

2. A measurement method for light or X-ray optics according to claim 1, characterized in that said second process of finding surface displacements comprises:
    a sub-process of calculating and storing a set of coefficients from geometrical positions of said optical elements employed in said optics for use in approximating a relation between surface displacements of said optical elements and wave-front distortions of said optics as a linear relation;

a sub-process of obtaining coefficients and constant terms of simultaneous equations for calculating said surface displacements at said points on said optical-element surfaces by multiplication and summation of matrices whose elements are said coefficients, vectors whose elements are measured values of said wave-front distortions connected with ray positions inside an aperture, constant matrices, constant vectors and scalars; and a sub-process of finding solutions to said simultaneous equations by numerical calculation.

3. An exposure method using projection optics including a set of processes of finding errors of said projection optics and correcting said projection optics between two consecutive exposure processes in an iterative sequence of exposure processes, wherein said set of processes comprises:

a first process of finding individual figure and placement errors of surfaces of optical elements employed in said projection optics by measuring wave-front distortions of said projection optics, and finding surface displacements in directions normal to said surfaces at a plurality of points on said surfaces; and a second process of correcting figures and positions of said surfaces of said optical elements based on results obtained from said first process.

4. An exposure method according to claim 3, characterized in that said first process comprises:

a sub-process of finding wave-front distortions of said projection optics at a plurality of points distributed inside an exposure field on an original-pattern side of said projection optics by repeating the following steps:

a step of positioning optics for focusing a measurement beam and positioning a reference spherical surface so as to focus said measurement beam on a position of one of said points;

a step of positioning a concave mirror for reflecting said measurement beam so as to make a center of curvature of said concave mirror coincide with a point on which said measurement beam originating from said position should be focused; and a step of measuring wave-front distortions of said projection optics by means of interferometric measurement.

5. An exposure apparatus comprising:

a first substrate having a pattern to be projected;

a second substrate on which said pattern is to be projected;

a means for positioning said second substrate; and projection optics for projecting said pattern onto said second substrate, characterized in that said exposure apparatus further comprises:

a light source for generating a measurement beam;

an interferometric measurement means;

positionable interferometric-measurement beam focusing optics;

a positionable reference spherical surface; and a concave mirror fixed on said means for positioning said second substrate.

6. An exposure apparatus according to claim 5, characterized in that a center of curvature of said reference spherical surface coincides with the surface of said first substrate in an exposed state, and a center of curvature of said concave mirror coincides with the surface of said second substrate in an exposed state.

7. An exposure apparatus according to claim 5, characterized in that said projection optics comprise a plurality of reflectors each provided with a plurality of actuators for changing a surface figure and a surface position of a corresponding reflector and a means for controlling displacements output by said actuators.

8. An exposure apparatus according to claim 5, further comprising a means for storing a set of coefficients defining relations between position errors on surfaces of optical elements constituting said projection optics and variations in wave-front distortion of said projection optics, wherein said position errors are reflective-surface errors in directions normal to said surfaces at a plurality of points on said surfaces.

9. An exposure apparatus according to claim 7, further comprising a means for storing a set of coefficients defining relations between displacements output by said actuators and variations in wave-front distortion of said projection optics.

10. An exposure apparatus according to claim 6, characterized in that said projection optics comprise a plurality of reflectors each provided with a plurality of actuators for changing a surface figure and a surface position of a corresponding reflector and a means for controlling displacements output by said actuators.

11. An exposure apparatus according to claim 6, further comprising a means for storing a set of coefficients defining relations between position errors on surfaces of optical elements constituting said projection optics and variations in wave-front distortion of said projection optics, wherein said position errors are reflective-surface errors in directions normal to said surfaces at a plurality of points on said surfaces.

12. An exposure apparatus according to claim 7, further comprising a means for storing a set of coefficients defining relations between position errors on surfaces of optical elements constituting said projection optics and variations in wave-front distortion of said projection optics, wherein said position errors are reflective-surface errors in directions normal to said surfaces at a plurality of points on said surfaces.

13. A measurement method for light or X-ray optics comprising:

a first process of measuring wave-front distortions at a plurality of observation points in an effective imaging region of said optics, wherein said first process comprises the steps of:

positioning an image point at one of said observation points;

measuring a wave-front distortion at said one observation point where said image point is positioned;

repeating said positioning and measuring steps for obtaining wave-front distortions at all of said observation points; and a second process of finding surface displacements at a plurality of points on surfaces of optical elements constituting said optics in directions normal to said surfaces by calculation based on measured values of said wave-front distortions at all of said observation points.

14. A measurement method for light or X-ray optics according to claim 13, wherein said second process of finding surface displacements comprises:

a sub-process of calculating and storing a set of coefficients from geometrical positions of said optical elements employed in said optics for use in approximating a relation between surface displacements of said optical elements and wave-front distortions of said optics as a linear relation;

a sub-process of obtaining coefficients and constant terms of simultaneous equations for calculating said surface displacements at said points on said optical element surfaces by multiplication and summation of matrices whose elements are said coefficients, vectors whose elements are measured values of said wave-front distortions connected with ray positions inside an aperture, constant matrices, constant vectors and scalars; and a sub-process of finding solutions to said simultaneous equations by numerical calculation.

* * * * *